(12) United States Patent
Kinsman et al.

(10) Patent No.: US 6,734,529 B2
(45) Date of Patent: May 11, 2004

(54) VERTICALLY MOUNTABLE INTERPOSER AND ASSEMBLY

(75) Inventors: Larry D. Kinsman, Boise, ID (US); Walter L. Moden, Meridian, ID (US); Warren M. Farnworth, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/165,158

(22) Filed: Jun. 6, 2002

(65) Prior Publication Data

US 2002/0149100 A1 Oct. 17, 2002

Related U.S. Application Data

(63) Continuation of application No. 09/651,491, filed on Aug. 30, 2000, now Pat. No. 6,437,435, which is a continuation of application No. 09/001,406, filed on Dec. 31, 1997, now Pat. No. 6,191,474.

(51) Int. Cl.[7] .............................................. H01L 23/12
(52) U.S. Cl. ........................ 257/622; 257/618; 257/693; 361/802; 361/772; 439/62; 439/86
(58) Field of Search ................................ 257/693, 678, 257/701, 779, 618, 619, 620, 621, 622, 623, 624, 625, 626, 627, 628; 361/802, 788, 748, 772; 439/62, 86, 91

(56) References Cited

U.S. PATENT DOCUMENTS

| | | | |
|---|---|---|---|
| 4,670,770 A | * 6/1987 | Tai ................................ 357/60 |
| 4,782,028 A | * 11/1988 | Farrier et al. ................... 437/3 |
| 4,794,092 A | * 12/1988 | Solomon ....................... 437/51 |
| 4,815,979 A | 3/1989 | Porter |
| 4,855,809 A | 8/1989 | Malhi et al. |
| 4,922,378 A | * 5/1990 | Malhi et al. ................. 361/387 |
| 4,967,146 A | * 10/1990 | Morgan et al. ............. 324/158 |
| 4,992,849 A | 2/1991 | Corbett et al. |
| 4,992,850 A | 2/1991 | Corbett et al. |
| 4,998,886 A | 3/1991 | Werner |
| 5,197,887 A | 3/1993 | Davidge et al. |
| 5,266,833 A | 11/1993 | Capps |
| 5,276,590 A | 1/1994 | Budman et al. |
| 5,279,029 A | 1/1994 | Burns |
| 5,451,815 A | 9/1995 | Taniguchi et al. |
| 5,484,965 A | 1/1996 | Woychik |
| 5,581,877 A | 12/1996 | Woychik et al. |
| 5,854,534 A | 12/1998 | Beilin et al. |
| 5,940,277 A | 8/1999 | Farnworth et al. |
| 6,128,201 A | 10/2000 | Brown et al. |
| 6,198,630 B1 | 3/2001 | Cromwell |
| 6,207,475 B1 | 3/2001 | Lin et al. |
| 6,219,909 B1 | 4/2001 | Ogawa et al. |
| 6,280,201 B1 | 8/2001 | Morris |
| 6,295,209 B1 | 9/2001 | Farnworth et al. |
| 6,343,171 B1 | 1/2002 | Yoshimura et al. |
| 6,426,642 B1 | * 7/2002 | Akram et al. ............... 324/765 |

* cited by examiner

*Primary Examiner*—Matthew Smith
*Assistant Examiner*—Renzo N. Rocchegiani
(74) *Attorney, Agent, or Firm*—TraskBritt

(57) ABSTRACT

A support assembly for mounting a semiconductor device vertically relative to a carrier substrate. The support assembly includes an interposer to which the semiconductor device is attached. The support assembly also includes traces carried on the interposer, which electronically connect the semiconductor device to contacts on the interposer. The contacts are disposed along a single edge of the interposer. The invention also includes an alignment device for releasably mounting the support assembly. The alignment device, which mounts to a carrier substrate, includes one or more receptacles. As a support assembly is inserted into a receptacle, the alignment device establishes an electrical connection between the contacts and corresponding terminals on the carrier substrate. The assembly may also include a cover that attaches to the top of the alignment device and biases the interposer against the carrier substrate.

17 Claims, 5 Drawing Sheets

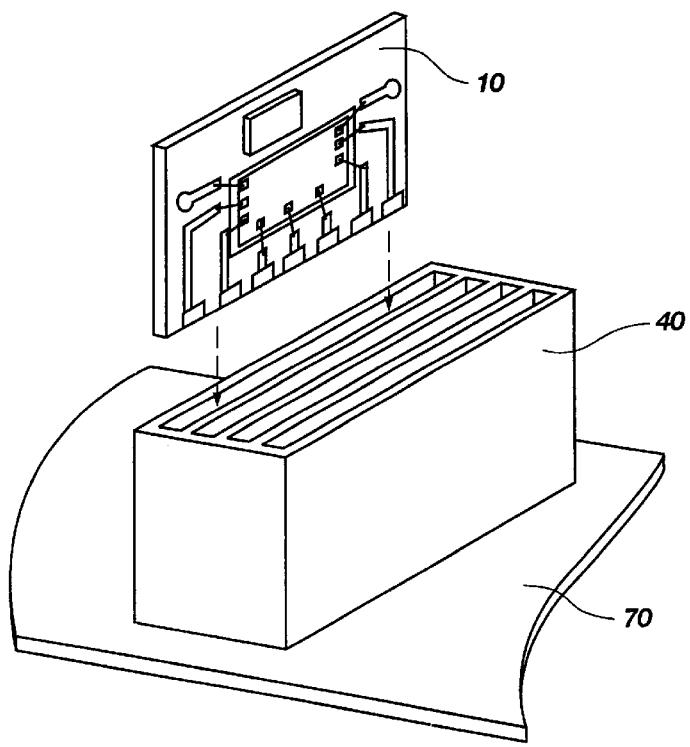
Fig. 1
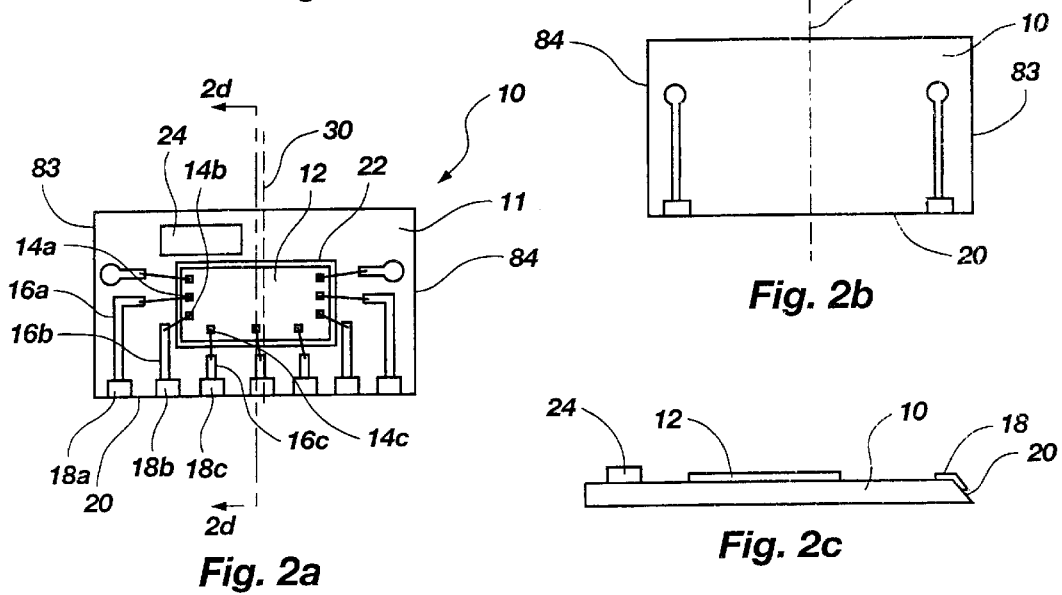
Fig. 2a
Fig. 2b
Fig. 2c
Fig. 2d

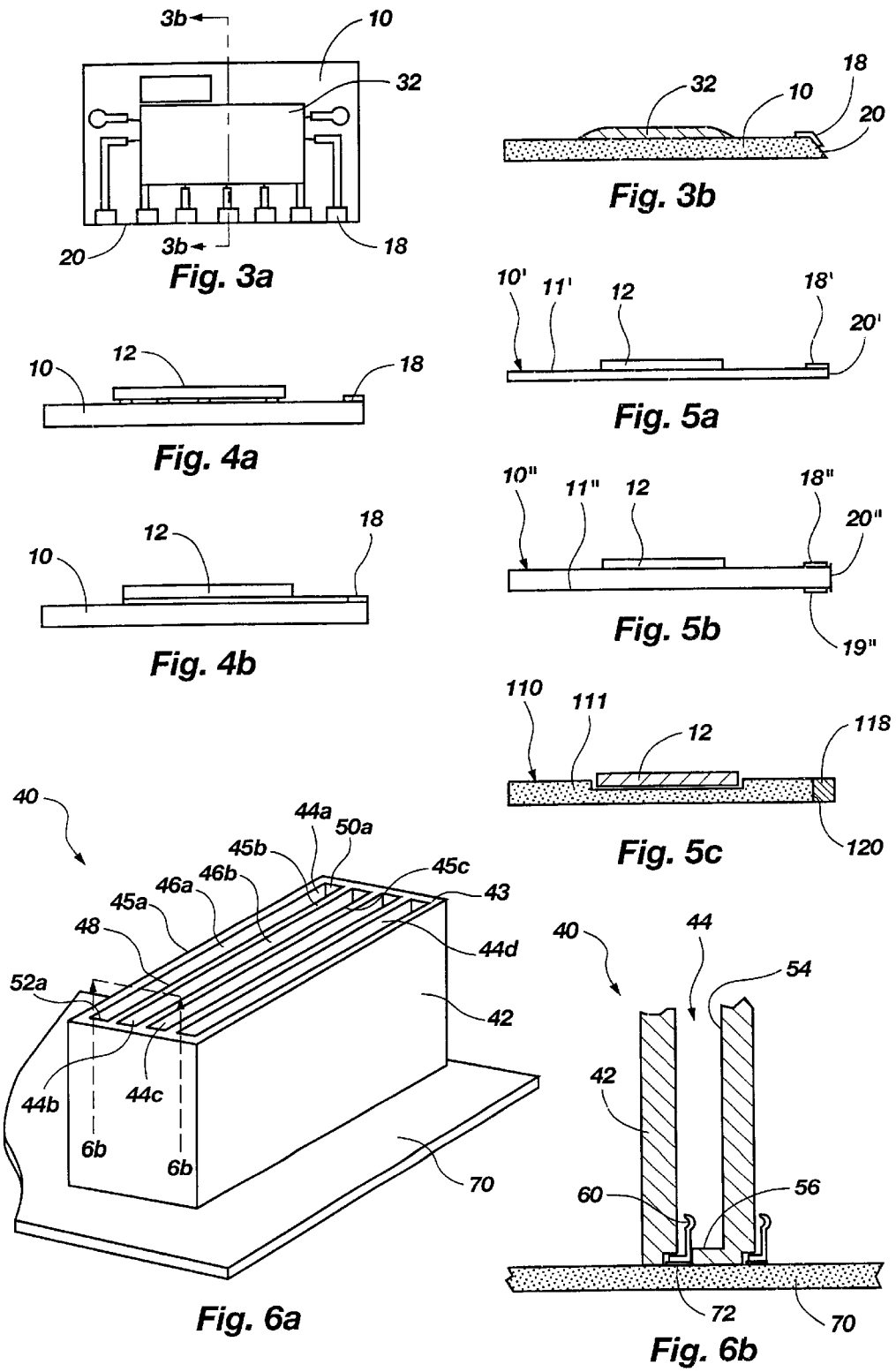

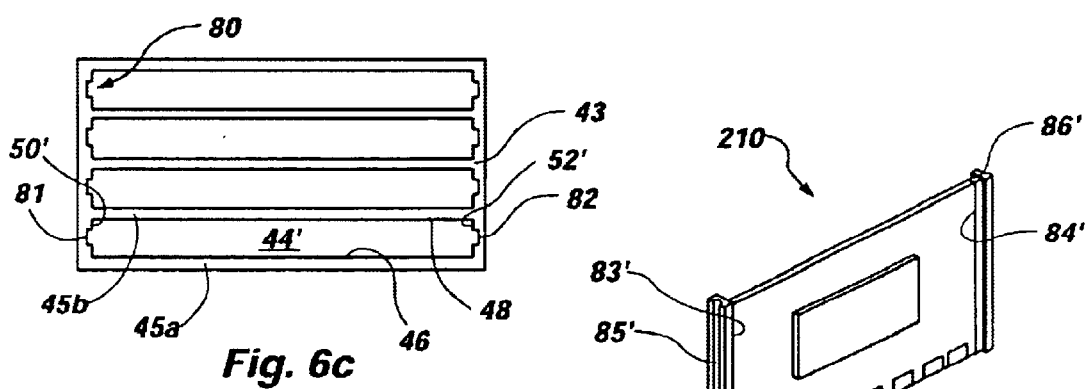
Fig. 6c
Fig. 7
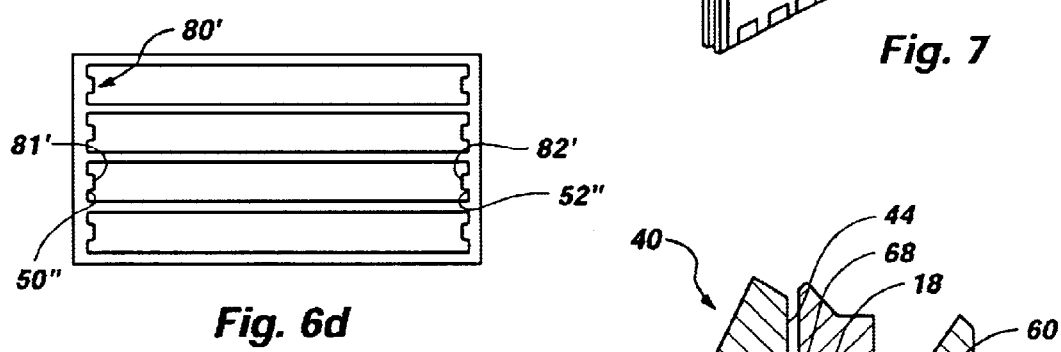
Fig. 6d
Fig. 8
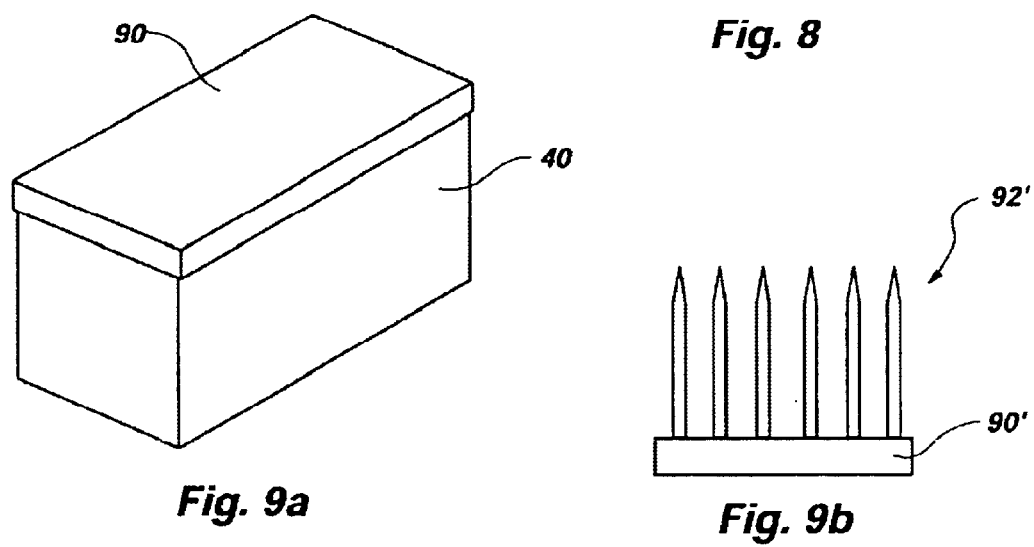
Fig. 9a
Fig. 9b

VERTICALLY MOUNTABLE INTERPOSER AND ASSEMBLY

CROSS-REFERENCE TO RELATED APPLICATIONS

This application is a continuation of application Ser. No. 09/651,491, filed Aug. 30, 2000, now U.S. Pat. No. 6,437,435, issued Aug. 20, 2002, which is a continuation of application Ser. No. 09/001,406, filed Dec. 31, 1997, now U.S. Pat. No. 6,191,474, issued Feb. 20, 2001.

BACKGROUND OF THE INVENTION

1. Field of the Invention

The present invention relates to support assemblies which electrically and structurally attach semiconductor devices to circuit boards. In particular, the present invention relates to support assemblies which orient semiconductor devices perpendicularly relative to circuit boards. Preferably, the support assembly of the present invention is readily installable upon, removable from, and reinstallable upon a circuit board.

2. State of the Art

The use of support boards for mounting semiconductor dice to a circuit board is known. Many support assemblies include electrically conductive leads which extend therefrom. The leads establish an electrical connection between the bond pads of the die and the corresponding terminals on a circuit board. Exemplary devices are described in the following U.S. Pat. No. 5,484,965 (the "'965 patent"), issued to Gerard A. Woychik on Jan. 16, 1996; U.S. Pat. No. 5,581,877 (the "'877 patent"), issued to Gerard A. Woychik and John C. Mather on Dec. 10, 1996; U.S. Pat. No. 5,451,815 (the "'815 patent"), issued to Norio Tanaguchi et al. on Sep. 19, 1995; U.S. Pat. No. 5,266,833 (the "'833 patent"), issued to David G. Capps on Nov. 30, 1993; U.S. Pat. No. 4,992,849 (the "'849 patent"), issued to Tim J. Corbett and Alan G. Wood on Feb. 12, 1991; and U.S. Pat. No. 4,992,850 (the "'850 patent"), issued to Tim J. Corbett and Alan G. Wood on Feb. 12, 1991.

Due to their permanent attachment to a circuit board, many single inline package devices are somewhat undesirable. Many single inline package devices attach to a circuit board by an electrically conductive bond, such as solder. Other single inline packages are attached to a circuit board with permanent bonding materials, such as epoxy or acrylic. Thus, users cannot readily remove and replace such devices. Further, some single inline packages include multiple integrated circuits attached thereto, making them somewhat undesirable because a user could not readily replace one bad die on such a device.

Some vertically mountable support assemblies have multiple laminated layers. The thickness of many such devices causes them to consume a significant amount of area on a circuit board. The '815 patent discloses one such device, wherein leads extend from the bottom of the device in more than one plane. The illustrated device has four layers and four corresponding rows of leads extending from the bottom thereof.

Other vertically mountable die support assemblies include electrical contacts on more than one edge thereof. This configuration is somewhat problematic in that each of the edges of such devices must communicate electronically with a circuit board. Consequently, a user's ability to remove and replace such devices is hindered. An exemplary device is described in the '833 patent.

Moreover, the interposers of the '833 patent are insertable into a socket which creates an interference fit between each electrical contact on the device and an electrical trace on the socket. However, it would be difficult to insert such a support structure into a base which exerts sufficient pressure on all four sides of the die to establish and maintain an adequate interference contact between the bond pads and the electrical connections. Furthermore, the amount of circuitry that would be required to establish an electrical connection between a circuit board and contacts which are distant therefrom would impart such a device with a relatively high impedance and slow the overall speed of a system which includes such a device.

Thus, a vertically mountable interposer is needed which is readily removable from and replaceable upon a carrier substrate. An interposer with good heat dissipation and reduced pitch limitation is also needed. There is also a need for a thin, flat interposer which protects an attached semiconductor device and any associated devices that are also attached to the interposer.

BRIEF SUMMARY OF THE INVENTION

The assembly of the present invention includes a thin, flat interposer which supports and protects a semiconductor device and an alignment device which is attachable to a carrier substrate. The interposer may include a recess, into which the semiconductor device is disposed, which decreases the overall width of the semiconductor device-intetposer combination and protects the semiconductor device. Bond pads of the semiconductor device are electrically connected to electrical traces on the interposer. Each of the electrical traces leads to one of a plurality of electrical contacts disposed proximate a single edge of the interposer.

An embodiment of the alignment device includes a base including one or more receptacles formed therein. The base is preferably mounted to the carrier substrate. At least one of the receptacles is adapted to receive an interposer in its top end. The other end of each receptacle includes an intermediate conductive element which electrically connects one or more of the contacts on the interposer to their corresponding terminals on the carrier substrate. As an interposer is inserted completely into a receptacle, an electrical connection is established between the carrier substrate and the semiconductor device.

The present invention also includes a method of securing a semiconductor device to a carrier substrate. A computer which includes the interposer is also within the scope of the present invention.

Advantages of the present invention will become apparent to those of ordinary skill in the relevant art through a consideration of the appended drawings and the ensuing description.

BRIEF DESCRIPTION OF THE SEVERAL VIEWS OF THE DRAWINGS

FIG. 1 is a perspective view of the support assembly and alignment device assembly of the present invention;

FIG. 2a is a top plan view of a first embodiment of the support assembly of the present invention;

FIG. 2b is a rear plan view of the support assembly of FIG. 2a;

FIG. 2c is a side plan view of the support assembly of FIG. 2a;

FIG. 2d is a cross-section taken along line 2d—2d of FIG. 2a;

FIG. 3a is a top plan view of an embodiment of the support assembly which includes a protective cover over the semiconductor device;

FIG. 3b is a cross-section taken along line 3b—3b of FIG. 3a;

FIG. 4a is a side plan view of an interposer, illustrating a second variation of the attachment of a semiconductor device thereto;

FIG. 4B is a side plan view of the support assembly, illustrating a third variation of the attachment of a semiconductor device thereto;

FIG. 5a is a side plan view of a second embodiment of the support assembly;

FIG. 5B is a side plan view of a third embodiment of the support assembly;

FIG. 5c is a side plan view of a fourth embodiment of the support assembly;

FIG. 6a is a frontal perspective view of a first embodiment of an alignment device according to the present invention;

FIG. 6b is a cross-section taken along line 6b—6b of FIG. 6a;

FIG. 6c is a top plan view of an alignment device, illustrating a first alignment mechanism;

FIG. 6d is a top plan view of an alignment device, illustrating a second alignment mechanism;

FIG. 7 is a frontal perspective view of an alternative embodiment of the support assembly;

FIG. 8 is a side plan view of an intermediate conductive element, illustrating contact with the support assembly;

FIGS. 9a and 9b illustrate embodiments of an alignment device cover;

DETAILED DESCRIPTION OF THE INVENTION

Figure 10A:
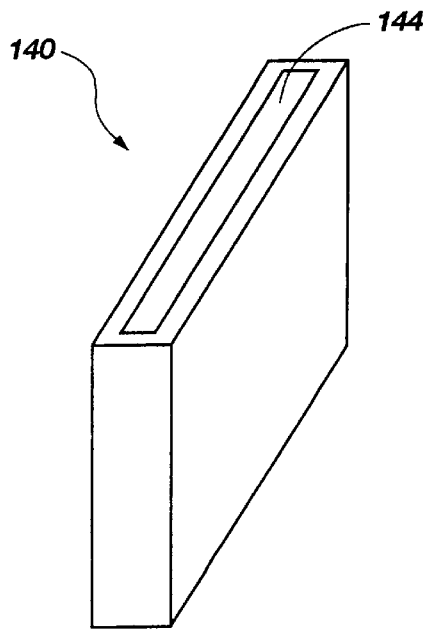
FIGS. 10a through 10e illustrate various alternative embodiments of the alignment device.

With reference to FIG. 1, the first embodiment of the support assembly and alignment device assembly of the present invention includes a support assembly 10 and an alignment device 40. Alignment device 40 is attachable to a carrier substrate 70, such as a printed circuit board.

FIGS. 2a through 2d illustrate support assembly 10, which includes an interposer 11, a semiconductor device 12 disposed thereon and electrically attached to traces 16a, 16b, 16c, etc. carried on the interposer. Traces 16a, 16b, 16c, etc. conduct electrical impulses from the bond pads 14a, 14b, 14c, etc. of semiconductor device 12 to contacts 18a, 18b, 18c, etc., respectively. Contacts 18a, 18b, 18c, etc. are disposed along a bottom edge 20 of interposer 11. Bottom edge 20 may include a bevel, which facilitates insertion of semiconductor device 12 into alignment device 40 (see FIG. 1). Other electronic devices 24 which are ancillary to semiconductor device 12, including without limitation, chip capacitors and power/ground planes, may also be disposed upon interposer 11.

Interposer 11 is formed from a material which withstands the high temperatures typically generated by semiconductor dice during operation, resists expansion and deformation when exposed to such temperatures, has good thermal conductivity, is an insulator, is formable into thin layers, and upon which metallic traces and contacts may be carried. Materials which are useful for manufacturing interposer 11 include, without limitation, ceramics, FR4 board, BT resins, borophosphosilicate glass (BPSG), phosphosilicate glass (PSG) and borosilicate glass (BSG). Interposer 11 may be manufactured by known methods for fabricating carrier substrates.

Interposer 11 may include a recess 22 formed in one side thereof. Preferably, recess 22 has a length and a width slightly larger than those of semiconductor device 12. However, recess 22 may have any depth. A preferred depth maintains the structural integrity of interposer 11 while adequately protecting semiconductor device 12 and reducing the overall thickness of the semiconductor device-interposer combination.

The use of an interposer 11 which has a greater width than semiconductor device 12 is preferable since such an interposer is less pitch limited than the semiconductor device. Preferably, interposer 11 includes a standardized number of contacts 18 along bottom edge 20, which are laterally spaced from one another at a standardized pitch. Contacts 18a, 18b, 18c, etc. may be positioned at a specific location relative to a center line 30 of interposer 11 or relative to a side thereof. Alternatively, the number and pitch of contacts 18 may be non-standardized.

Any semiconductor device 12 which is known or used in the industry may be attached to an interposer 11 according to the present invention. An electrical connection between bond pads 14a, 14b, 14c, etc. of semiconductor device 12 and their corresponding traces 16a, 16b, 16c, etc. on interposer II may be established by any method known in the art. Such methods include, but are not limited to, wire bonding, flip chip attachment (see FIG. 4a), tape automated bonding (see FIG. 4b) and the use of z-axis elastomers.

When semiconductor device 12 is attached to interposer 11, the combined cross-sectional thickness of the semiconductor device-interposer combination is preferably less than about 40 mils (about 1 mm). More preferably, the semiconductor device-interposer combination has a thickness of approximately 20 to 30 mils or less.

Following attachment of semiconductor device 12 to interposer 11, a protective cover 32 may be applied over the semiconductor device, as illustrated in FIGS. 3a and 3b. Preferably, protective cover 32 is an inexpensive material which tolerates the temperatures typically generated by a semiconductor device during operation, has good heat conductivity, cures quickly, and costs little to apply to the semiconductor device. Such materials include, without limitation, resins, glob tops and acrylics. Other protective covers 32 which attach to interposer 11 over semiconductor device 12 are also within the scope of the invention. Such protective covers 32 include, but are not limited to, thin, flat layers of ceramic, glass, plastics and other materials which have the aforementioned properties, and injection molded covers.

Other embodiments of an interposer which are useful in the support assembly of the present invention are also within the scope of the present invention. FIGS. 5a through 5c illustrate some alternative embodiments of the interposer.

With reference to FIG. 5a, a second embodiment of support assembly 10' is shown. Support assembly 10' does not include a recess for holding semiconductor device 12. Interposer 11' may have a thickness as small as about 12 mils or less. Preferably, along with semiconductor device 12 attached thereto and any protective cover or coating over the semiconductor device, the interposer-semiconductor device combination has a thickness of about 20 mils or less.

FIG. 5B illustrates a third embodiment of the support assembly 10", which has contacts 18" and 19" formed proximal to bottom edge 20" on both major surfaces of the interposer 11". Such placement of contacts 18" and 19" reduces pitch limitations by facilitating the placement of an increased number of contacts along a single edge of interposer 11". Similarly, placement of contacts 18" and 19" on both surfaces of interposer 11" facilitates a reduction in the necessary size of the support assembly 10".

Turning now to FIG. 5c, a fourth embodiment of support assembly 110 includes contacts 118 exposed along the bottom edge 120 thereof. Methods for forming electrical contacts on the edge of a carrier substrate are known in the relevant art, such as U.S. Pat. No. 5,635,670, issued to Kenji Kubota et al. on Jun. 3, 1997, the disclosure of which is hereby incorporated by reference, which discloses a method that is useful for manufacturing interposer 111. Other embodiments of the support assembly and interposer may include combinations of any of the described elements, as well as other elements or combinations of the above-described elements and other elements.

FIGS. 6a and 6b show an embodiment of alignment device 40, which includes a base 42 that defines one or more receptacles 44a–44d through the top surface of the alignment device. Preferably, base 42 is fixedly mounted to a carrier substrate 70. Alignment device 40 is attached to carrier substrate 70 with screws, protrusions which extend into or through the carrier substrate, adhesives, epoxies, solders, and other substrate attachment mechanisms known in the art.

Receptacles 44 each include two sides 46a, 46b, 46c, etc. and 48 and two ends 50a, 50b, 50c, etc. and 52. Preferably, in embodiments of alignment device 40 which include more than one receptacle 44a, 44b, 44c, etc., each of the receptacles are arranged parallel to one another. More preferable, as illustrated in FIG. 6a, the receptacles are arranged in a single row, such that side 48 of one receptacle 44a is adjacent to side 46b of the next receptacle 44b. Preferably, sides 46a, 46b, 46c, etc. and 48 are slightly longer than the width of the support assembly 10 that is to be inserted therein (see FIG. 1). Similarly, ends 50a, 50b, 50c, etc. and 52a, 52b, 52c, etc. are slightly longer than the overall thickness of the semiconductor device-interposer combination. Thus, the lengths of sides 46, 48 and ends 50, 52 facilitate insertion of support assembly 10 (see FIG. 1) into receptacle 44. Preferably, in order to facilitate removal of support assembly 10 from receptacle 44, ends 50a, 50b, 50c, etc. and 52 are about 20 mils to about 100 mils longer than the semiconductor device-interposer thickness. Thus, the clearance on either side of support assembly 10 is about 10 mils to about 50 mils.

Receptacles 44a, 44b, 44c, etc. extend downward into alignment device 40. Each receptacle 44 also has an upper end 54, which opens to the top surface 43 of alignment device 40, and a lower end 56. An interposer 11 (see FIG. 1) inserts into receptacle 44 through upper end 54. One or more intermediate conductive elements 60 are disposed within lower end 56 of receptacle 44.

Preferably, walls 45a, 45b, 45c, etc., located on each side of receptacles 44a, 44b, 44c, etc., respectively, facilitate alignment of support assemblies 10 (see FIG. 1) within the receptacles. Referring now to FIG. 6c, each receptacle 44' may also include an alignment mechanism 80. A preferred embodiment of alignment mechanism 80 includes guides 81 and 82, formed within ends 50' and 52', respectively. Guides 81 and 82 extend from the upper end of receptacle 44' and at least partially down ends 50' and 52', respectively. Guides 81 and 82 are adapted to engage a corresponding edge of the support assembly 10 (edges 83 and 84, respectively, shown in FIGS. 2a and 2b).

FIG. 6d illustrates a variation of the alignment mechanism 80', wherein guides 81' and 82' extend from ends 50" and 52", respectively. FIG. 7 illustrates an alternative embodiment of the support assembly 210, which includes slots 85' and 86' which extend from edges 83' and 84', respectively, and which are complementary to guides 81' and 82' shown in FIG. 6d.

FIG. 8 illustrates a preferred embodiment of intermediate conductive element 60. Each intermediate conductive element 60 is a leaf spring which extends through base 42 of alignment device 40 to connect to a corresponding terminal 72. Intermediate conductive element 60 includes a terminal contact end 62, an interposer contact end 64, and a spring arm 66 adjoining the terminal contact end and the interposer contact end. Preferably, terminal contact end 62, spring arm 66 and interposer contact end 64 are integral with one another. Each terminal contact end 62 is electrically connected to a corresponding terminal 72 on carrier substrate 70. During the insertion of a support assembly 10 (see FIG. 1) into receptacle 44, spring arm 66 is forced away from the interposer. The reactive (i.e., spring) force of spring arm 66 forces interposer contact end 64 against its corresponding interposer contact 18 in order to establish an electrical contact between the interposer contact end of the intermediate conductive element and the contact on the interposer. Thus, intermediate conductive element 60 establishes an electrical connection between carrier substrate 70 and a semiconductor device 12 on interposer 11 (see FIG. 2a).

Preferably, interposer contact end 64 is bent outwardly to form an outward extension 68. Outward extension 68 facilitates movement of interposer contact end 64 as a support assembly 10 (see FIG. 1) is inserted into receptacle 44. The shape of outward extension 68 may also prevent damage to the interposer and its contacts during insertion of the interposer into receptacle 44.

Preferably, alignment device 40 is manufactured from a material which maintains its shape and rigidity at the relatively high temperatures that are generated during the operation of a semiconductor device. An alignment device material which has good thermal conductivity properties and which may be formed into thin layers is also preferable. Materials including, without limitation, copper, aluminum and injection molded plastics are useful for manufacturing alignment device 40.

With reference to FIGS. 9a and 9b, alignment device 40 may also include a cover 90. Preferably, cover 90 is a removable member which prevents dust and debris from entering the receptacles (not shown) of alignment device 40 and contaminating the semiconductor device. FIG. 9b depicts a cover 90' which includes a heat sink 92' to facilitate the transfer of heat away from the dice (not shown), support assemblies (not shown) and alignment device 40.

Although FIGS. 1, 6a through 6d, 9a and 9b depict embodiments of the alignment device 40 which include a plurality of receptacles 44a, 44b, 44c, etc., each of which completely receive a support assembly 10 (see FIG. 1), other embodiments of the alignment device are also within the scope of the invention. FIGS. 10a through 10e illustrate some alternative embodiments of the alignment device which are useful in the assembly of the present invention.

Figure 10B:
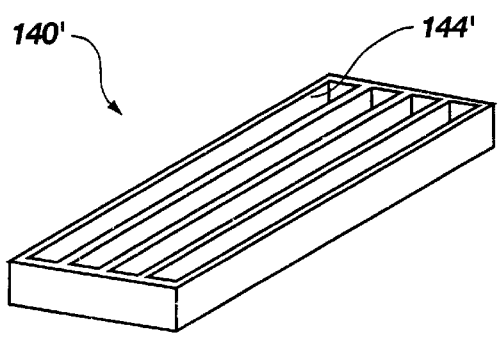
Figure 10C:
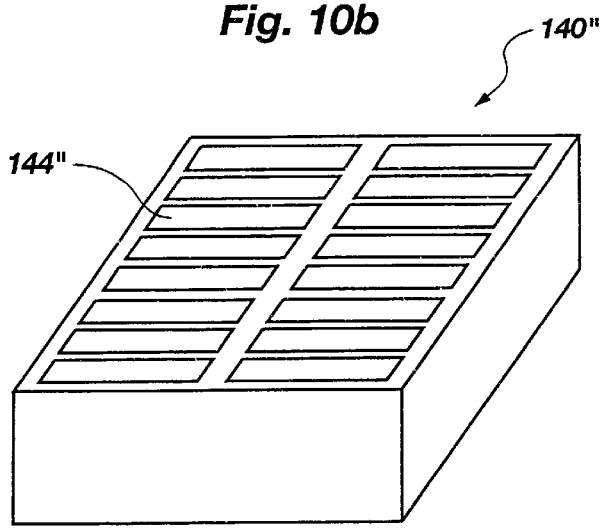

FIG. 10a shows a second embodiment of the alignment device 140, which includes a single receptacle 144. FIG. 10b depicts a third embodiment of the alignment device 140', the receptacles 144' of which only receive a bottom portion of each support assembly 10 (see FIG. 1). FIG. 10c shows a fourth embodiment of the alignment device 140", wherein the receptacles 144" are arranged in a matrix-type arrangement.

Figure 10D:
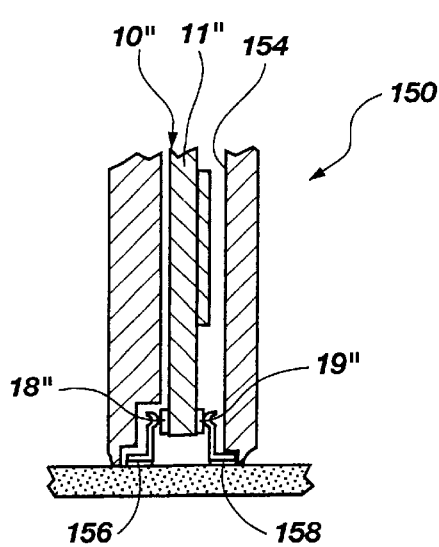

Referring now to FIG. 10d, another embodiment of the alignment device 150 is shown. Alignment device 150 is useful with support assembly 10" of FIG. 5b. Each receptacle 154 of alignment device 150 includes two rows of intermediate conductive elements 156 and 158 therein. Intermediate conductive elements 156 and 158 engage corresponding contacts 18" and 19", respectively, on both sides of interposer 11".

Figure 10E:
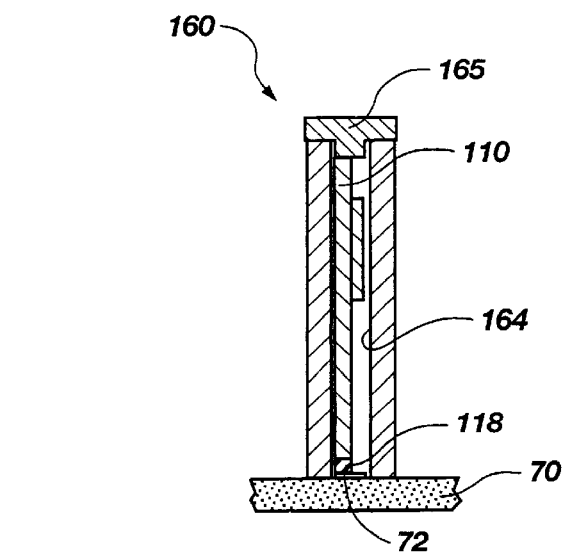

Turning now to FIG. 10e, an alignment device 160 which is useful with support assembly 110 (described above in reference to FIG. 5c) has receptacles 164 formed completely therethrough (i.e., each receptacle opens to both the top and bottom surfaces of the alignment device). A cover 165 exerts downward force on each support assembly 110 to establish an electrical contact between contacts 118 on the interposer and their corresponding terminals 72. The electrical connection may be made by an interference contact, with Z-axis elastomer, or similar means.

Alignment devices having combinations of these features, as well as alignment devices with other features and with combinations of the above and other features, are to be considered within the scope of the present invention.

Referring again to FIG. 1, as an example of the use of the assembly of the present invention, support assembly 10 is inserted into receptacle 44 through upper end 54. Walls 45 ensure the proper alignment of contacts 18 with their corresponding intermediate conductive elements 60 (see FIG. 8) in receptacle 44. As support assembly 10 is inserted into receptacle 44, contacts 18a, 18b, 18c, etc. are abutted by their respective intermediate conductive elements 60, creating an electrically conductive connection between semiconductor device 12 and carrier substrate 70. A cover 90, 90' (see FIGS. 9a and 9b) may then be disposed over alignment device 40.

FIG. 10e illustrates a method for establishing an electrical connection between support assembly 110 and alignment device 160. Support assembly 110 is inserted into receptacle 164, and cover 165 is placed on alignment device 160 to exert downward pressure against the support assembly and establish an electrical connection between contacts 118 and their respective terminals 72.

Figure 11:
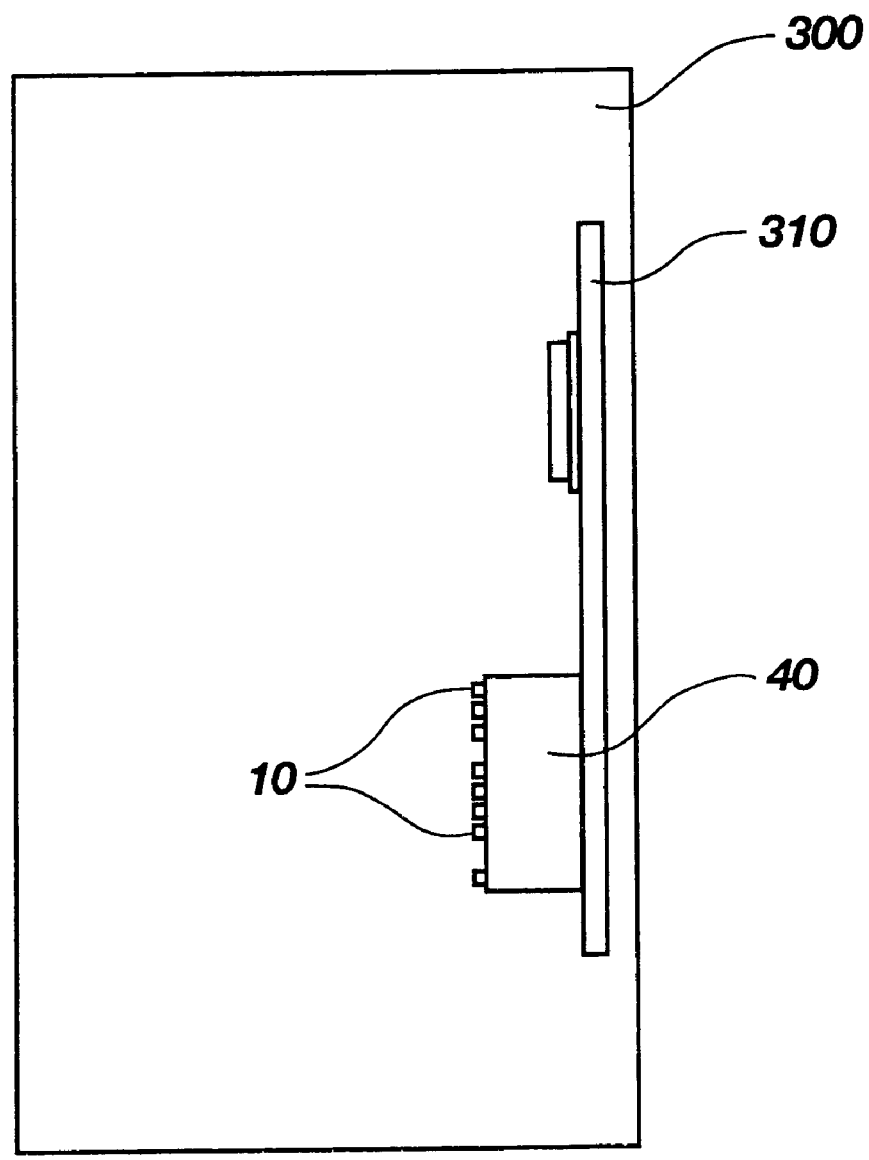
FIG. 11 is a schematic illustration of the use of the support assembly and alignment device assembly in a computer.

FIG. 11 illustrates a computer 300 including a carrier substrate 310. Alignment device 40 attaches to carrier substrate 310. One or more support assemblies 10 are insertable into alignment device 40, which establishes an electrical connection between the semiconductor devices 12 (see FIG. 1) of the support assemblies and carrier substrate 310. Thus, with the insertion of support assembly 10 into a receptacle (not shown) of alignment device 40, semiconductor device 12 thereof is operatively associated with computer 300. When an alignment device which includes a plurality of receptacles is used, one or more of the receptacles may have a support assembly disposed therein. Empty receptacles may be used at a later time for upgrading the computer by inserting additional support assemblies which carry semiconductor devices thereon.

The described embodiments of the present invention provide several advantages. The density of semiconductor devices per surface area of the carrier substrate is high. When used in combination with a convection-type air circulation system, such as those known and used in the industry, the vertical orientation of the interposer facilitates an increase in heat transfer away from the semiconductor device. The assembly of the present invention is also user upgradable. Moreover, the support assembly protects the semiconductor device disposed thereon.

Preferably, the interposer is wider than the semiconductor device attached thereto. Advantageously, the interposer facilitates the distribution of more electrical contacts along a single edge thereof than would the semiconductor device. Thus, the support assembly of the present invention does not have the same pitch constraints as a smaller semiconductor device. The support assembly may also include other devices, including, without limitation, chip capacitors and power/ground planes.

Although the foregoing description contains many specificities, these should not be construed as limiting the scope of the present invention, but merely as providing illustrations of selected presently preferred embodiments. Similarly, other embodiments of the invention may be devised which do not depart from the spirit or scope of the present invention. The scope of this invention is, therefore, indicated and limited only by the appended claims and their legal equivalents, rather than by the foregoing description. All additions, deletions and modifications to the invention as disclosed herein which fall within the meaning and scope of the claims are embraced within their scope.

What is claimed is:

1. An assembly for connecting a semiconductor device to a carrier substrate in nonparallel relation thereto, comprising:
    an interposer including a first side and a second side, at least one recess formed in one of said first side and said second side, and a plurality of conductive traces extending from locations proximate said at least one recess to corresponding contact areas positioned adjacent to a single edge of said interposer; and
    at least one electronic device disposed within said at least one recess and including bond pads that are electrically connected to corresponding traces of said plurality of conductive traces.

2. The assembly of claim 1, wherein said at least one electronic device is a semiconductor device.

3. The assembly of claim 1, wherein said bond pads are connected to said corresponding traces with electrical connections comprising at least one of wire bonds, tape automated bonds, a z-axis elastomer and flip-chip connections.

4. The assembly of claim 1, wherein said at least one electronic device further comprises:
    a plurality of electronic devices disposed within said at least one recess.

5. The assembly of claim 4, wherein said at least one recess comprises:
    a plurality of recesses formed in at least one of said first side and said second side, each of said plurality of said recesses containing one of said plurality of electronic devices.

6. The assembly of claim 1, wherein said single edge is beveled.

7. The assembly of claim 1, further comprising:
    an alignment device including a receptacle configured to hold said interposer in nonparallel relation to a carrier substrate.

8. The assembly of claim 7, wherein said alignment device includes an alignment mechanism configured to engage an edge of said interposer.

9. The assembly of claim 8, wherein said alignment mechanism comprises a guide recess formed within at least one interior surface of said receptacle.

10. The assembly of claim 8, wherein said alignment mechanism comprises a guide protruding from at least one interior surface and configured to engage a guide recess formed within at least one of said first side and said second side of said interposer.

11. The assembly of claim 7, wherein said alignment device includes at least one conductive element comprising a first end comprising a leaf spring for contacting a contact area on one of said corresponding contact areas and a second end in electrical contact with a conductive element on said carrier substrate.

12. The assembly of claim 1, further comprising:
   a protective covering substantially encapsulating said at least one electronic device.

13. An interposer for connecting at least one semiconductor device to a carrier substrate, comprising:
   a substantially planar substrate including at least one location for receiving the at least one semiconductor device;
   a bevel along a single edge of said substantially planar substrate;
   a plurality of conductive traces extending from locations proximate said at least one location toward said bevel; and
   a plurality of contact areas on a surface of said substantially planar substrate, proximate said bevel and in communication with corresponding conductive traces of said plurality of conductive traces.

14. The interposer of claim 13, wherein said at least one location is configured to receive at least one semiconductor device including bond pads that correspond to contact areas of said plurality of contact areas.

15. The interposer of claim 14, wherein said at least one location is configured to receive a plurality of semiconductor devices.

16. The interposer of claim 13, wherein at least said bevel is configured to be received by a receptacle of an alignment device, said receptacle being configured to hold said interposer and establish communication between at least one semiconductor device thereon and a carrier substrate.

17. The interposer of claim 13, wherein at least one of said plurality of contact areas is on said bevel.

* * * * *

UNITED STATES PATENT AND TRADEMARK OFFICE
CERTIFICATE OF CORRECTION

PATENT NO. : 6,734,529 B2
DATED : May 11, 2004
INVENTOR(S) : Larry D. Kinsman, Walter L. Moden and Warren M. Farnworth It is certified that error appears in the above-identified patent and that said Letters Patent is hereby corrected as shown below:

<u>Title page,</u>
Item [56], References Cited, U.S. PATENT DOCUMENTS, add the following references:
-- 3,573,617  4/1971  Randolf et al.
  4,776,804  10/1988  Johnson et al.
  6,089,920  7/2000  Farnworth et al.
  6,453,550  9/2002  Farnworth et al. --

Signed and Sealed this

Tenth Day of August, 2004

JON W. DUDAS
*Acting Director of the United States Patent and Trademark Office*